(12) United States Patent
Sasaoka

(10) Patent No.: US 10,141,111 B2
(45) Date of Patent: Nov. 27, 2018

(54) METHOD OF MANUFACTURING STACKED CERAMIC CAPACITOR INCLUDING IDENTIFYING DIRECTION OF STACKING IN STACKED CERAMIC CAPACITOR

(71) Applicant: Murata Manufacturing Co., Ltd., Nagaokakyo-shi, Kyoto-fu (JP)

(72) Inventor: Yoshikazu Sasaoka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 165 days.

(21) Appl. No.: 15/226,000

(22) Filed: Aug. 2, 2016

(65) Prior Publication Data

US 2016/0343507 A1    Nov. 24, 2016

Related U.S. Application Data

(62) Division of application No. 14/102,616, filed on Dec. 11, 2013, now Pat. No. 9,431,175.

(30) Foreign Application Priority Data

Dec. 28, 2012    (JP) ................................. 2012-287755

(51) Int. Cl.
| | |
|---|---|
| *H01G 4/30* | (2006.01) |
| *H01G 4/012* | (2006.01) |
| *G01R 33/02* | (2006.01) |
| *G01R 33/12* | (2006.01) |

(52) U.S. Cl.
CPC ............... *H01G 4/30* (2013.01); *G01R 33/02* (2013.01); *G01R 33/12* (2013.01); *H01G 4/012* (2013.01); *Y10T 29/43* (2015.01)

(58) Field of Classification Search
CPC ........ G01R 33/02; G01R 33/12; H01G 4/012; H01G 4/30; Y10T 29/43
See application file for complete search history.

(56) References Cited

U.S. PATENT DOCUMENTS

| | | | |
|---|---|---|---|
| 9,431,175 B2 * | 8/2016 | Sasaoka | .................. H01G 4/012 |
| 9,884,347 B2 * | 2/2018 | Sasaoka | .................. B07C 5/362 |
| 2012/0152604 A1 | 6/2012 | Ahn et al. | |

FOREIGN PATENT DOCUMENTS

JP    2012-134498 A    7/2012

OTHER PUBLICATIONS

Official Communication issued in corresponding Japanese Patent Application No. 2015-007077, dated Oct. 4, 2016.
Sasaoka, "Method of Identifying Direction of Stacking in Stacked Ceramic Capacitor", U.S. Appl. No. 14/102,616, filed Dec. 11, 2013.

* cited by examiner

*Primary Examiner* — Minh Trinh
(74) *Attorney, Agent, or Firm* — Keating & Bennett, LLP

(57) ABSTRACT

In a method of identifying a direction of stacking in a stacked ceramic capacitor, while density of magnetic flux generated from a magnetism generation apparatus is measured with a magnetic flux density measurement instrument, a stacked ceramic capacitor is caused to pass between a magnetism generation apparatus and the magnetic flux density measurement instrument and variation in magnetic flux density at least at the time of passage of the stacked ceramic capacitor is measured. Based on a result of measurement of magnetic flux density, a direction in which a plurality of internal electrodes are stacked in the stacked ceramic capacitor is identified.

8 Claims, 14 Drawing Sheets

METHOD OF MANUFACTURING STACKED CERAMIC CAPACITOR INCLUDING IDENTIFYING DIRECTION OF STACKING IN STACKED CERAMIC CAPACITOR

BACKGROUND OF THE INVENTION

1. Field of the Invention

The present invention relates to a method of identifying a direction of stacking in a stacked ceramic capacitor, an apparatus for identifying a direction of stacking in a stacked ceramic capacitor, and a method of manufacturing a stacked ceramic capacitor.

2. Description of the Related Art

A stacked ceramic capacitor has a plurality of internal electrodes stacked in one direction. Therefore, in connection with the stacked ceramic capacitor, there is a demand for identifying a direction in which the internal electrodes are stacked. For example, however, when a stacked ceramic capacitor has a square prism shape, it is difficult to identify based on appearance a direction in which internal electrodes are stacked in the stacked ceramic capacitor.

For example, Japanese Patent Laying-Open No. 7-115033 describes a method allowing identification of a direction in which internal electrodes are stacked in a stacked ceramic capacitor, regardless of appearance. Specifically, Japanese Patent Laying-Open No. 7-115033 discloses a method of measuring magnetic flux density in a stacked ceramic capacitor by applying a certain magnetic field to one surface to which an internal electrode layer is not extracted and identifying a direction in which internal electrode layers are stacked based on intensity of magnetization. This method makes use of a difference in measured magnetic flux density between a state in which a capacitor is arranged in an orientation in which internal electrodes are substantially in parallel to a magnetic flux (as a capacitor, internal electrodes extend in a direction perpendicular to a bottom surface) and a state in which a capacitor is arranged in an orientation in which the internal electrodes are substantially perpendicular to the magnetic flux (as a capacitor, internal electrodes are in a direction parallel to a bottom surface).

A difference in measured magnetic flux density, however, is very small, between a case in which a direction of stacking of internal electrodes is parallel to a direction of magnetic flux and a case in which a direction of stacking of internal electrodes is perpendicular to a direction of magnetic flux. In addition, measured magnetic flux density is greatly dependent on a positional relationship between a magnet, and a sensor probe and a capacitor. In particular, in a small stacked ceramic capacitor, an influence caused by a positional relationship between a magnet, and a sensor probe and a capacitor on measured magnetic flux density is significant.

Thus, since a difference in magnetic flux density measured at the time when a direction is different is small and the measured magnetic flux density is significantly different depending on a position of a capacitor at the time of measurement, it is difficult to accurately identify a direction in a stacked ceramic capacitor with the method described in Japanese Patent Laying-Open No. 7-115033.

This issue will more specifically be described. For example, a case in which a magnetic flux density for a stacked ceramic capacitor having a length dimension of 1 mm, a width dimension of 0.5 mm, and a height dimension of 0.5 mm and having a capacitance of 4.7 µF is measured under certain measurement conditions is assumed. Maximum magnetic flux density of this stacked ceramic capacitor in a case in which a direction of stacking of internal electrodes is parallel to a direction of magnetic flux is approximately 53.6 mT. On the other hand, the maximum magnetic flux density of this stacked ceramic capacitor in a case in which a direction of stacking of internal electrodes is perpendicular to a direction of magnetic flux is approximately 52.3 mT. Therefore, in this stacked ceramic capacitor, a maximum value of magnetic flux density is different only by 1.3 mT between a case in which the direction of stacking of the internal electrodes is parallel to the direction of magnetic flux and the case in which the direction of stacking of the internal electrodes is perpendicular to the direction of magnetic flux. Thus, a difference in maximum value of magnetic flux density between the case in which the direction of stacking of the internal electrodes is parallel to the direction of magnetic flux and the case in which the direction of stacking of the internal electrodes is perpendicular to the direction of magnetic flux is only 2.4% with respect to the maximum value of magnetic flux density in the case in which the direction of stacking of the internal electrodes is parallel to the direction of magnetic flux.

In addition, a magnetic flux density of a stacked ceramic capacitor in which a direction of stacking of internal electrodes is parallel to a direction of magnetic flux at the time when a measurement position for the stacked ceramic capacitor is displaced by 0.3 mm from a central position of the stacked ceramic capacitor is approximately 52.3 mT, and it is substantially equal to the maximum value of magnetic flux density of the stacked ceramic capacitor (when a measurement position is at a central position of the stacked ceramic capacitor) when the direction of stacking of the internal electrodes is perpendicular to the direction of magnetic flux. Thus, when a measurement position for a stacked ceramic capacitor may change by 0.3 mm or more, it is difficult to identify a direction in a stacked ceramic capacitor. This issue is more noticeable because it becomes difficult to set a measurement position to a central position as a stacked ceramic capacitor is reduced in size, for example, when the stacked ceramic capacitor has a 1005 size or smaller having a length dimension of 1 mm, a width dimension of 0.5 mm, and a height dimension of 0.5 mm.

SUMMARY OF THE INVENTION

Preferred embodiments of the present invention provide a method allowing accurate identification of a direction of stacking in a stacked ceramic capacitor.

A method of identifying a direction of stacking in a stacked ceramic capacitor according to a preferred embodiment of the present invention is a method of identifying a direction of stacking of a plurality of internal electrodes in a stacked ceramic capacitor including the plurality of internal electrodes stacked in one direction. The method of identifying a direction of stacking in a stacked ceramic capacitor includes the steps of measuring a variation in magnetic flux density at least at a time of passage of the stacked ceramic capacitor by causing the stacked ceramic capacitor to pass between a magnetism generation apparatus and a magnetic flux density measurement instrument while density of magnetic flux generated from the magnetism generation apparatus is measured with the magnetic flux density measurement instrument and identifying a direction of stacking of the plurality of internal electrodes in the stacked ceramic capacitor based on a result of measurement of magnetic flux density in the step of measuring the variation in magnetic flux density.

In a preferred embodiment of the present invention, in the step of identifying a direction of stacking, a maximum value of magnetic flux density is calculated based on a result of measurement of the magnetic flux density, and a direction of stacking of the plurality of internal electrodes in the stacked ceramic capacitor is identified based on the calculated maximum value of the magnetic flux density.

In a preferred embodiment of the present invention, in the step of identifying a direction of stacking, a first range which is a range of a maximum value of magnetic flux density in a case in which a direction of stacking of the plurality of internal electrodes in the stacked ceramic capacitor is parallel or substantially parallel to a direction of magnetic flux and a second range which is a range of the maximum value of magnetic flux density in a case in which a direction of stacking of the plurality of internal electrodes in the stacked ceramic capacitor is perpendicular or substantially perpendicular to a direction of magnetic flux are set, and a direction of stacking of the plurality of internal electrodes in the stacked ceramic capacitor is identified based on whether the maximum value of the measured magnetic flux density belongs to the first or second range.

In a preferred embodiment of the present invention, the step of measuring a variation in magnetic flux density is performed successively for each of a plurality of stacked ceramic capacitors aligned at an interval, and in the step of identifying a direction of stacking, a magnetic flux density immediately before passage of the stacked ceramic capacitor between the magnetism generation apparatus and the magnetic flux density measurement instrument is calculated based on the result of measurement of the magnetic flux density, and a direction of stacking of the plurality of internal electrodes in the stacked ceramic capacitor is identified based on the magnetic flux density immediately before passage.

In a preferred embodiment of the present invention, in the step of identifying a direction of stacking, a magnetic flux density immediately after passage of the stacked ceramic capacitor between the magnetism generation apparatus and the magnetic flux density measurement instrument is further calculated based on the result of measurement of the magnetic flux density, and a direction of stacking of the plurality of internal electrodes in the stacked ceramic capacitor is identified based on both of the magnetic flux density immediately before passage and the magnetic flux density immediately after passage.

In a preferred embodiment of the present invention, in the step of identifying a direction of stacking, a difference between a maximum value of magnetic flux density and a magnetic flux density immediately before the stacked ceramic capacitor reaches a position between the magnetism generation apparatus and the magnetic flux density measurement instrument is calculated based on the result of measurement of the magnetic flux density, and a direction of stacking of the plurality of internal electrodes in the stacked ceramic capacitor is identified based on the difference in magnetic flux density.

In a preferred embodiment of the present invention, in the step of identifying a direction of stacking, an average value of magnetic flux densities during passage of the stacked ceramic capacitor between the magnetism generation apparatus and the magnetic flux density measurement instrument is calculated based on the result of measurement of the magnetic flux density, and a direction of stacking of the plurality of internal electrodes in the stacked ceramic capacitor is identified based on the average value of the magnetic flux densities.

In a preferred embodiment of the present invention, in the step of identifying a direction of stacking, the result of measurement of the magnetic flux density is smoothed by taking a moving average of measured magnetic flux densities.

In a preferred embodiment of the present invention, in the step of measuring a variation in magnetic flux density, the stacked ceramic capacitor is not turned when the stacked ceramic capacitor is caused to pass between the magnetism generation apparatus and the magnetic flux density measurement instrument.

In a preferred embodiment of the present invention, in the step of measuring a variation in magnetic flux density, a variation in magnetic flux density at the time when each of a plurality of stacked ceramic capacitors passes is successively measured by causing a series of stacked ceramic capacitors, in which the stacked ceramic capacitor is accommodated in each of a plurality of accommodation chambers provided at an interval in a longitudinal direction of a tape body, to pass between the magnetism generation apparatus and the magnetic flux density measurement instrument in the longitudinal direction.

In a preferred embodiment of the present invention, the accommodation chamber is larger than the stacked ceramic capacitor in a plan view.

An apparatus for identifying a direction of stacking in a stacked ceramic capacitor according to a preferred embodiment of the present invention identifies a direction of stacking of a plurality of internal electrodes in a stacked ceramic capacitor including the plurality of internal electrodes stacked in one direction. The apparatus for identifying a direction of stacking in a stacked ceramic capacitor includes a magnetism generation apparatus, a magnetic flux density measurement instrument measuring density of magnetic flux generated from the magnetism generation apparatus, a transportation apparatus causing the stacked ceramic capacitor to pass between the magnetism generation apparatus and the magnetic flux density measurement instrument, and an identification portion. The magnetic flux density measurement instrument measures a variation in magnetic flux density at least at the time of passage of the stacked ceramic capacitor. The identification portion identifies a direction of stacking of the plurality of internal electrodes in the stacked ceramic capacitor based on a result of measurement of the magnetic flux density output from the magnetic flux density measurement instrument.

A method of manufacturing a stacked ceramic capacitor according to a preferred embodiment of the present invention includes the steps of fabricating a stacked ceramic capacitor including a plurality of internal electrodes stacked in one direction and identifying a direction of stacking of the plurality of internal electrodes in the stacked ceramic capacitor with the method of identifying a direction of stacking in a stacked ceramic capacitor described above.

According to various preferred embodiments of the present invention, a direction of stacking in a stacked ceramic capacitor is accurately identified.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
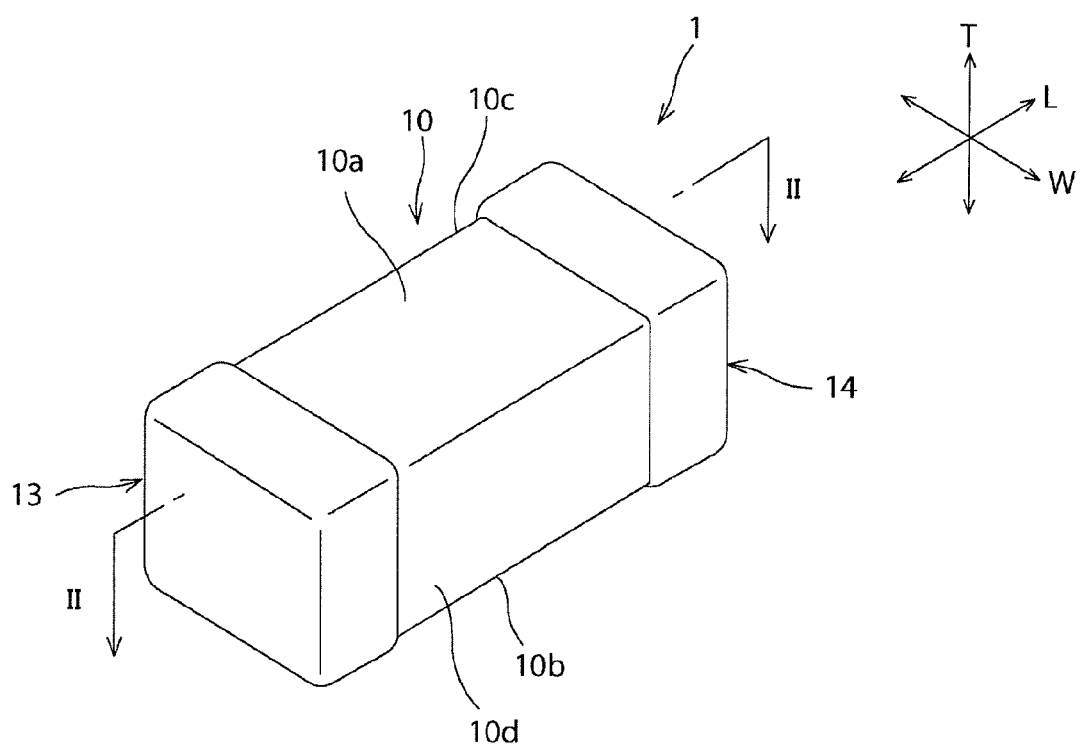
FIG. 1 is a schematic perspective view of a stacked ceramic capacitor according to a preferred embodiment of the present invention.

Various examples of preferred embodiments of the present invention will be described hereinafter. It is noted that the preferred embodiments described below are merely examples. The present invention is not limited to the preferred embodiments described below.

In addition, in each drawing referred to in a description of a preferred embodiment or the like, a member having substantially the same function has the same reference sign. Moreover, a drawing referred to in a preferred embodiment or the like is schematic. A scale or the like of a dimension of an object drawn in the drawings may be different from a scale or the like of a dimension of an actual object. A scale or the like of a dimension of an object may be different between the drawings. A specific scale or the like of a dimension of an object should be determined with reference to the description below.

In a preferred embodiment of the present invention, a method of identifying a direction of stacking in a stacked ceramic capacitor 1 shown in FIGS. 1 and 2 will be described. Initially, an example of a construction of stacked ceramic capacitor 1 to be identified will be described.

Figure 2:
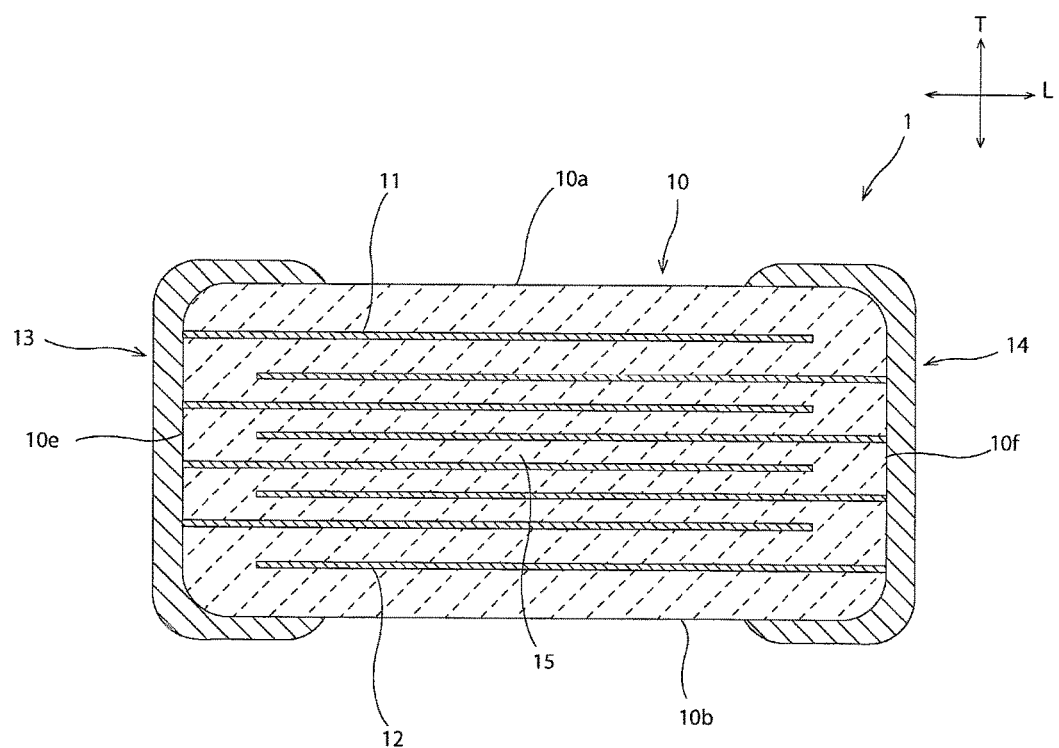
FIG. 2 is a cross-sectional view of the stacked ceramic capacitor in FIG. 1 when viewed in a direction of an arrow II-II.

As shown in FIGS. 1 and 2, stacked ceramic capacitor 1 includes a ceramic element 10. Ceramic element 10 preferably has a substantially parallelepiped shape, for example. Specifically, ceramic element 10 preferably has a square prism shape, for example. Ceramic element 10 includes first and second main surfaces 10a, 10b, first and second side surfaces 10c, 10d, and first and second end surfaces 10e, 10f (see FIG. 2).

First and second main surfaces 10a, 10b extend along a length direction L and a width direction W. First main surface 10a and second main surface 10b are parallel or substantially parallel to each other. First and second side surfaces 10c, 10d extend along length direction L and a thickness direction T. First side surface 10c and second side surface 10d are parallel or substantially parallel to each other. First and second end surfaces 10e, 10f extend along width direction W and thickness direction T. First end surface 10e and second end surface 10f are parallel or substantially parallel to each other.

A dimension of ceramic element 10 in length direction L is preferably from about 0.4 mm to about 2.0 mm and more preferably from about 0.6 mm to about 1.0 mm, for example. A dimension of ceramic element 10 in width direction W is preferably from about 0.2 mm to about 1.2 mm and more preferably from about 0.3 mm to about 0.5 mm, for example. A dimension of ceramic element 10 in thickness direction T is preferably from about 0.2 mm to about 1.2 mm and more preferably from about 0.3 mm to about 0.5 mm, for example.

What is called a 1005 size or smaller, in which a dimension in length direction L is not greater than about 1.0 mm and a dimension in width direction W and thickness direction T is not greater than about 0.5 mm, is preferred because a position of measurement of magnetic flux density tends to vary from a central position of a stacked ceramic capacitor in particular in a case of a small product not greater than the 1005 size. In addition, what is called a 0603 size or greater, in which a dimension in length direction L is not smaller than about 0.6 mm and a dimension in width direction W and thickness direction T is not smaller than about 0.3 mm, is preferred because higher density of internal electrodes facilitates identification of a direction based on magnetic flux density. For similar reasons, a stacked ceramic capacitor having a capacitance not lower than about 1 μF preferably is suitable for various preferred embodiments of the present invention.

Ceramic element 10 can be made, for example, of a material mainly composed of dielectric ceramics. Specific examples of dielectric ceramics include $BaTiO_3$, $CaTiO_3$, SrTiO$_3$, CaZrO$_3$, and the like. To ceramic element 10, for example, a sub component such as an Mn compound, an Mg compound, an Si compound, a Co compound, an Ni compound, a rare-earth compound, and the like may be added as appropriate.

It is noted that "substantially parallelepiped" includes a parallelepiped shape of which a corner portion or a ridge line portion is beveled or a parallelepiped of which corner portion or ridge line portion is rounded.

As shown in FIG. 2, a plurality of internal electrodes 11, 12 are provided in ceramic element 10. The plurality of internal electrodes 11, 12 are stacked in thickness direction T. Each internal electrode 11, 12 is arranged parallel or substantially parallel to length direction L and width direction W. In ceramic element 10, internal electrode 11 and internal electrode 12 are alternately provided in thickness direction T. A ceramic portion 15 is arranged between internal electrodes 11, 12 adjacent in thickness direction T. The internal electrodes 11, 12 adjacent in thickness direction T are opposed to each other with ceramic portion 15 located therebetween.

Internal electrode 11 is extracted to first end surface 10e. An external electrode 13 is provided on first end surface 10e. External electrode 13 is electrically connected to internal electrode 11. Internal electrode 12 is extracted to second end surface 10f. An external electrode 14 is provided on second end surface 10f. External electrode 14 is electrically connected to internal electrode 12.

Internal electrode 11, 12 can be composed of such a magnetic material as Ni, for example. External electrodes 13, 14 can be composed, for example, of an appropriate conductive material such as Ni, Cu, Ag, Pd, Au, and an Ag—Pd alloy.

Figure 3:
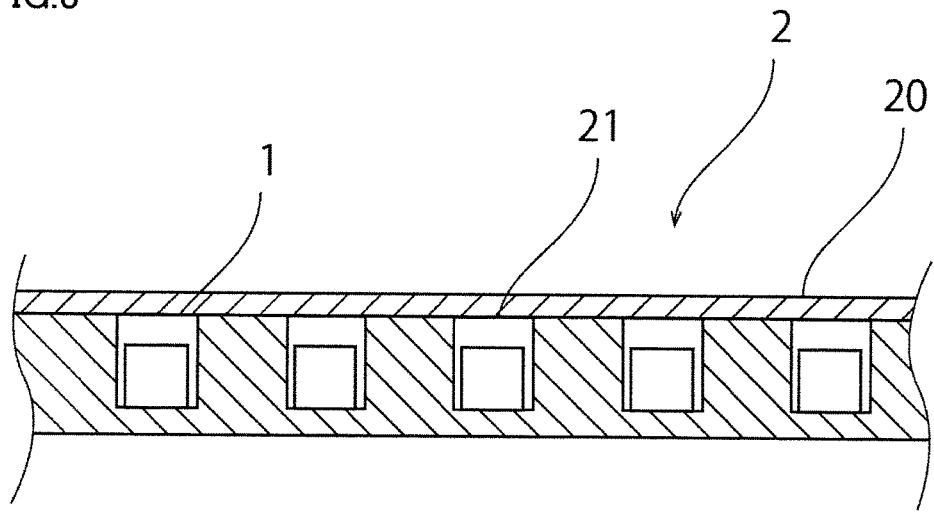
FIG. 3 is a cross-sectional view of a series of stacked ceramic capacitors according to a preferred embodiment of the present invention.
Figure 4:
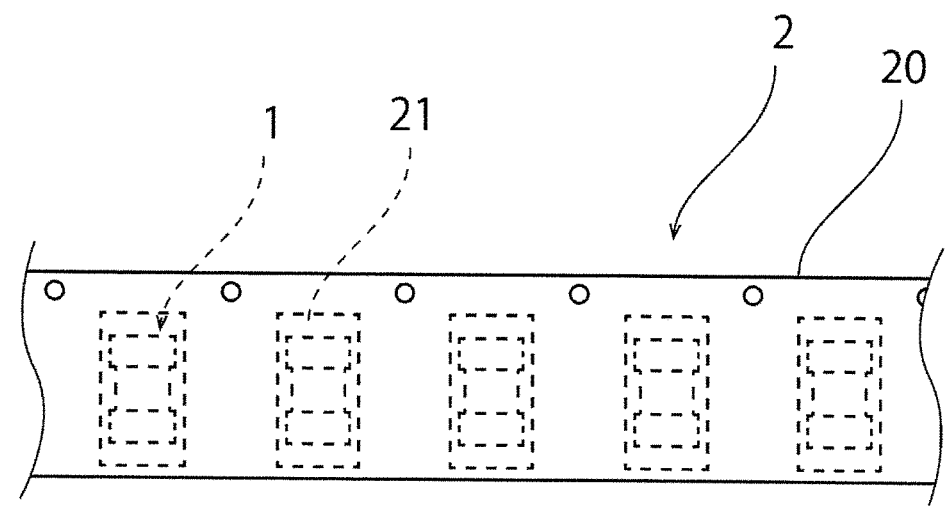
FIG. 4 is a plan view of the series of stacked ceramic capacitors according to a preferred embodiment of the present invention.

As shown in FIGS. 3 and 4, stacked ceramic capacitor 1 is included in a series of stacked ceramic capacitors 2. The series of stacked ceramic capacitors 2 includes a tape body 20. Tape body 20 includes a plurality of parallelepiped accommodation chambers 21 provided at an interval in a longitudinal direction. Stacked ceramic capacitor 1 is accommodated in each of the plurality of accommodation chambers 21. In a plan view, accommodation chamber 21 is greater than stacked ceramic capacitor 1. Therefore, in accommodation chamber 21, stacked ceramic capacitor 1 can move two-dimensionally. As a position of stacked ceramic capacitor 1 in accommodation chamber 21 varies for each accommodation chamber 21, an amount of variation from a central position of the stacked ceramic capacitor at the time of measurement of magnetic flux density also varies for each accommodation chamber 21.

It is noted that stacked ceramic capacitor 1 may be a stacked ceramic capacitor of a three-terminal or multi-terminal type including a side surface electrode, in addition to a two-terminal-type stacked ceramic capacitor as shown in FIG. 1.

An apparatus 3 for identifying a direction of stacking in a stacked ceramic capacitor (hereinafter simply referred to as an "identification apparatus 3") is an apparatus for identifying a direction of stacking of a plurality of internal electrodes 11, 12 in stacked ceramic capacitor 1. Hereinafter, a "direction of stacking of a plurality of internal electrodes 11, 12 in stacked ceramic capacitor 1" will herein be denoted as a "stacking direction in stacked ceramic capacitor 1."

Figure 5:
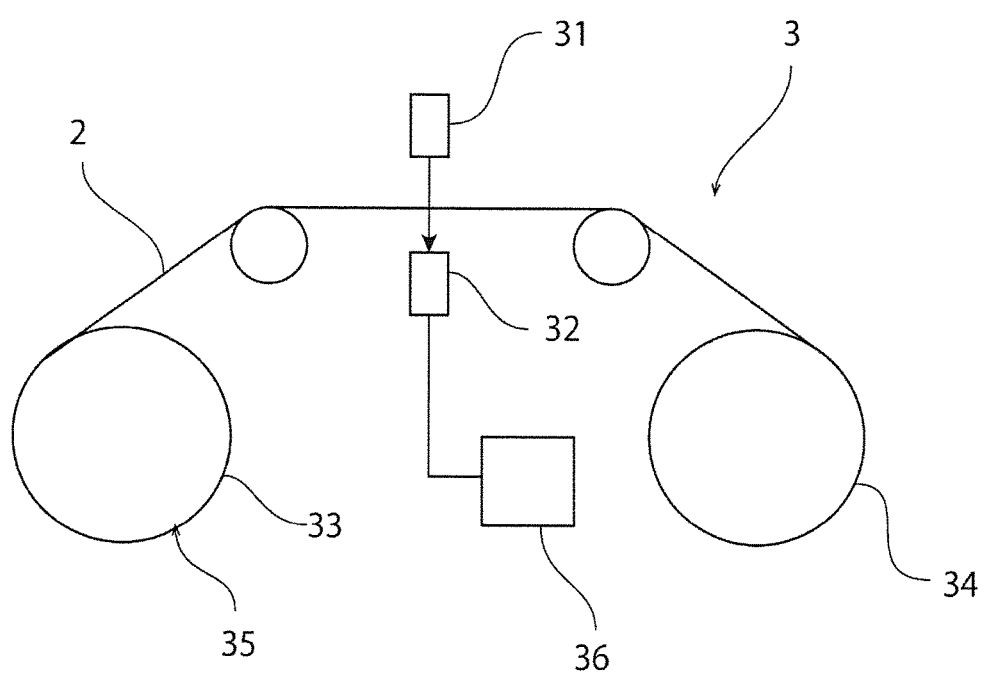
FIG. 5 is a schematic side view of an apparatus for identifying a direction of stacking in a stacked ceramic capacitor according to a preferred embodiment of the present invention.

As shown in FIG. 5, identification apparatus 3 includes a magnetism generation apparatus 31 and a magnetic flux density measurement instrument 32. Magnetic flux density measurement instrument 32 is arranged to be able to detect density of magnetic flux generated in magnetism generation apparatus 31. Magnetic flux density measurement instrument 32 measures density of magnetic flux generated from magnetism generation apparatus 31.

Identification apparatus 3 further includes a transportation apparatus 35. Transportation apparatus 35 causes stacked ceramic capacitor 1 to pass between magnetism generation apparatus 31 and magnetic flux density measurement instrument 32. Specifically, transportation apparatus 35 includes a first roller 33 and a second roller 34. The series of stacked ceramic capacitors 2 is wound around first roller 33, and the series of stacked ceramic capacitors 2 is sent from the first roller 33. The series of stacked ceramic capacitors 2 which has passed between magnetism generation apparatus 31 and magnetic flux density measurement instrument 32 is wound around second roller 34.

Magnetic flux density measurement instrument 32 measures variation in magnetic flux density at least at the time of passage of stacked ceramic capacitor 1. Magnetic flux density measurement instrument 32 outputs a result of measurement to an identification portion 36. Identification portion 36 identifies a direction of stacking in stacked ceramic capacitor 1 based on a result of measurement of magnetic flux density output from magnetic flux density measurement instrument 32. Identification portion 36 successively identifies a direction of stacking in stacked ceramic capacitor 1 for a plurality of stacked ceramic capacitors 1 arranged at an interval from one another in the series of stacked ceramic capacitors 2.

In manufacturing of stacked ceramic capacitor 1, initially, stacked ceramic capacitor 1 is fabricated. Then, fabricated stacked ceramic capacitor 1 is accommodated in tape body 20 to fabricate the series of stacked ceramic capacitors 2. Then, a direction of stacking in stacked ceramic capacitor 1 accommodated in the series of stacked ceramic capacitors 2 is identified. Consequently, for example, a ratio of alignment of stacked ceramic capacitors (a ratio of matching of a direction of stacking in a plurality of stacked ceramic capacitors) is checked, and when stacked ceramic capacitor 1 of which direction of stacking in stacked ceramic capacitor 1 is different from a desired direction is detected, that stacked ceramic capacitor 1 is marked or excluded.

A method of identification of a direction of stacking in stacked ceramic capacitor 1 carried out by identification portion 36 will now be described.

Figure 6:
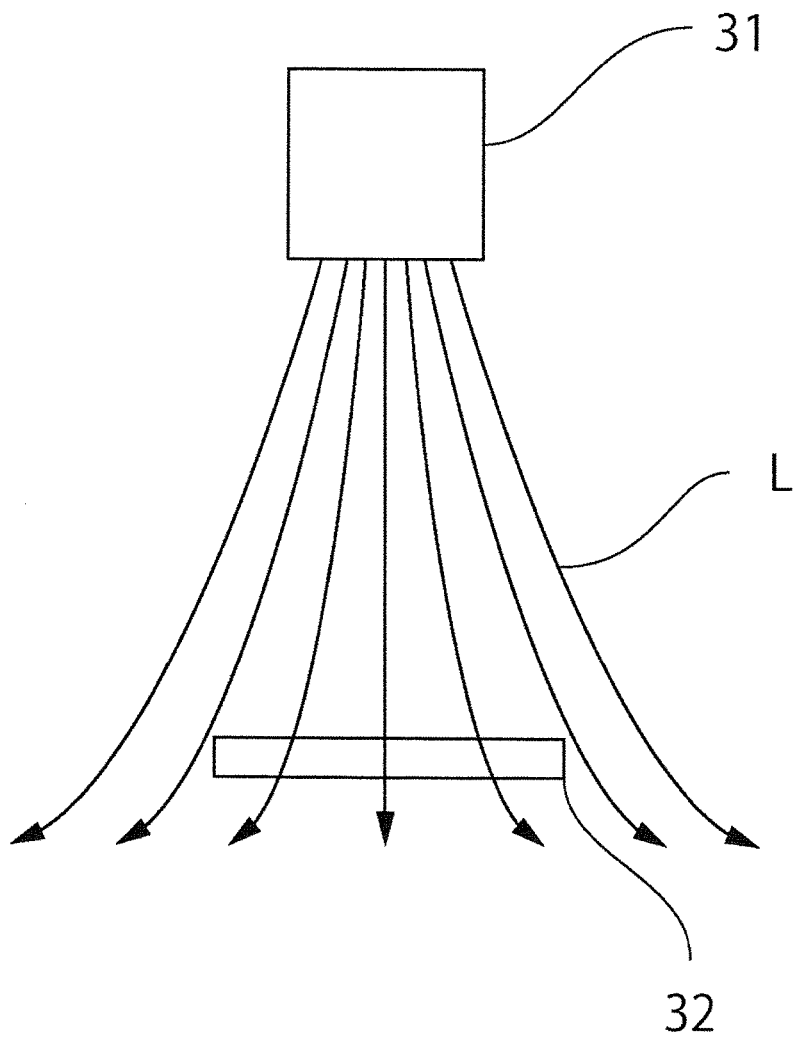
FIG. 6 is a schematic diagram of lines of magnetic force in a case in which no stacked ceramic capacitor is present between a magnetism generation apparatus and a magnetic flux density measurement instrument.

Initially, principles of the stacking direction identification method in the present preferred embodiment will be described with reference to FIGS. 6 to 8. For example, as shown in FIG. 6, while no stacked ceramic capacitor 1 is located between magnetism generation apparatus 31 and magnetic flux density measurement instrument 32, an interval between lines of magnetic force L which pass magnetic flux density measurement instrument 32 is greatest. In other words, the number of lines of magnetic force L per unit area is small and a low value for magnetic flux density is obtained.

Figure 7:
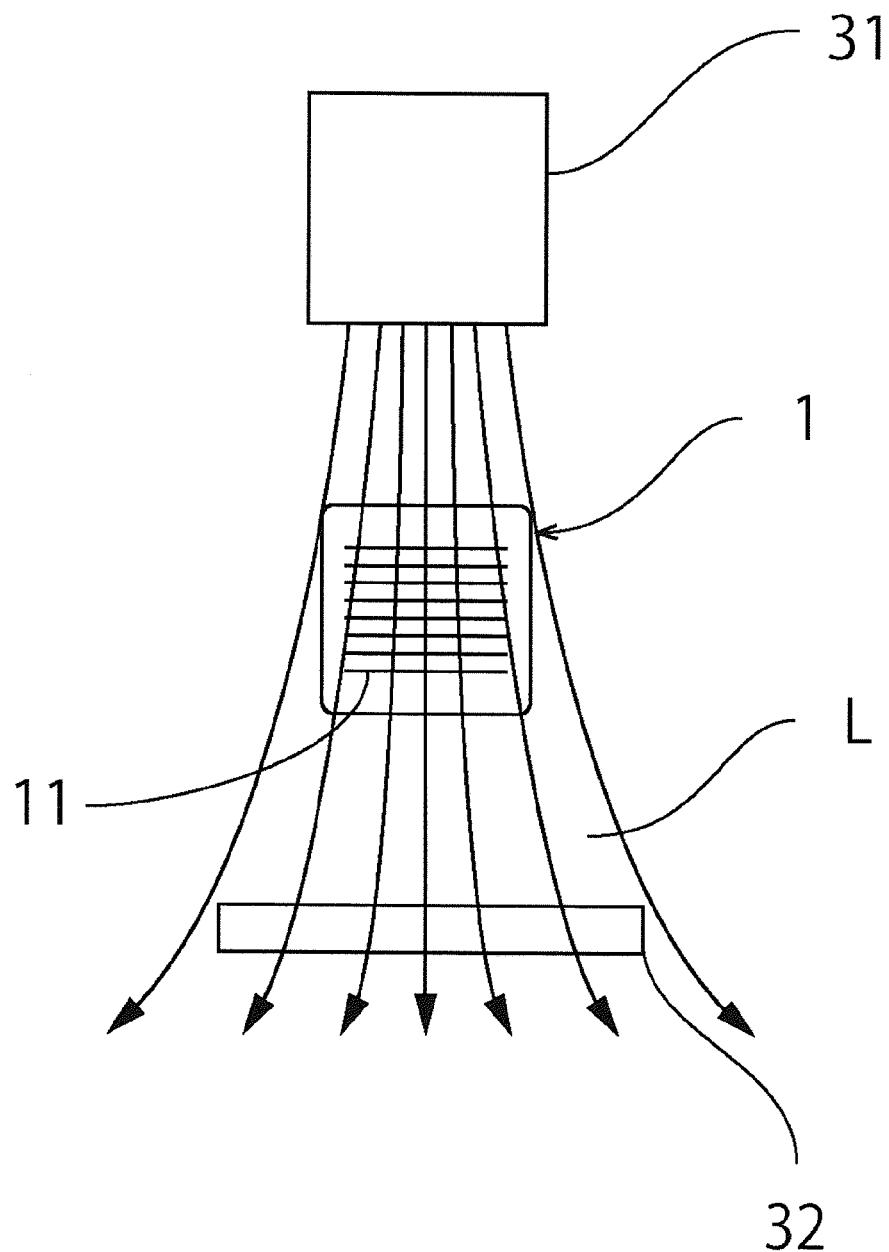
FIG. 7 is a schematic diagram of lines of magnetic force in a case in which a stacked ceramic capacitor is located between the magnetism generation apparatus and the magnetic flux density measurement instrument such that internal electrodes are perpendicular or substantially perpendicular to a direction of magnetic flux (as a capacitor, the internal electrodes extend in a direction parallel or substantially parallel to a bottom surface).
Figure 8:
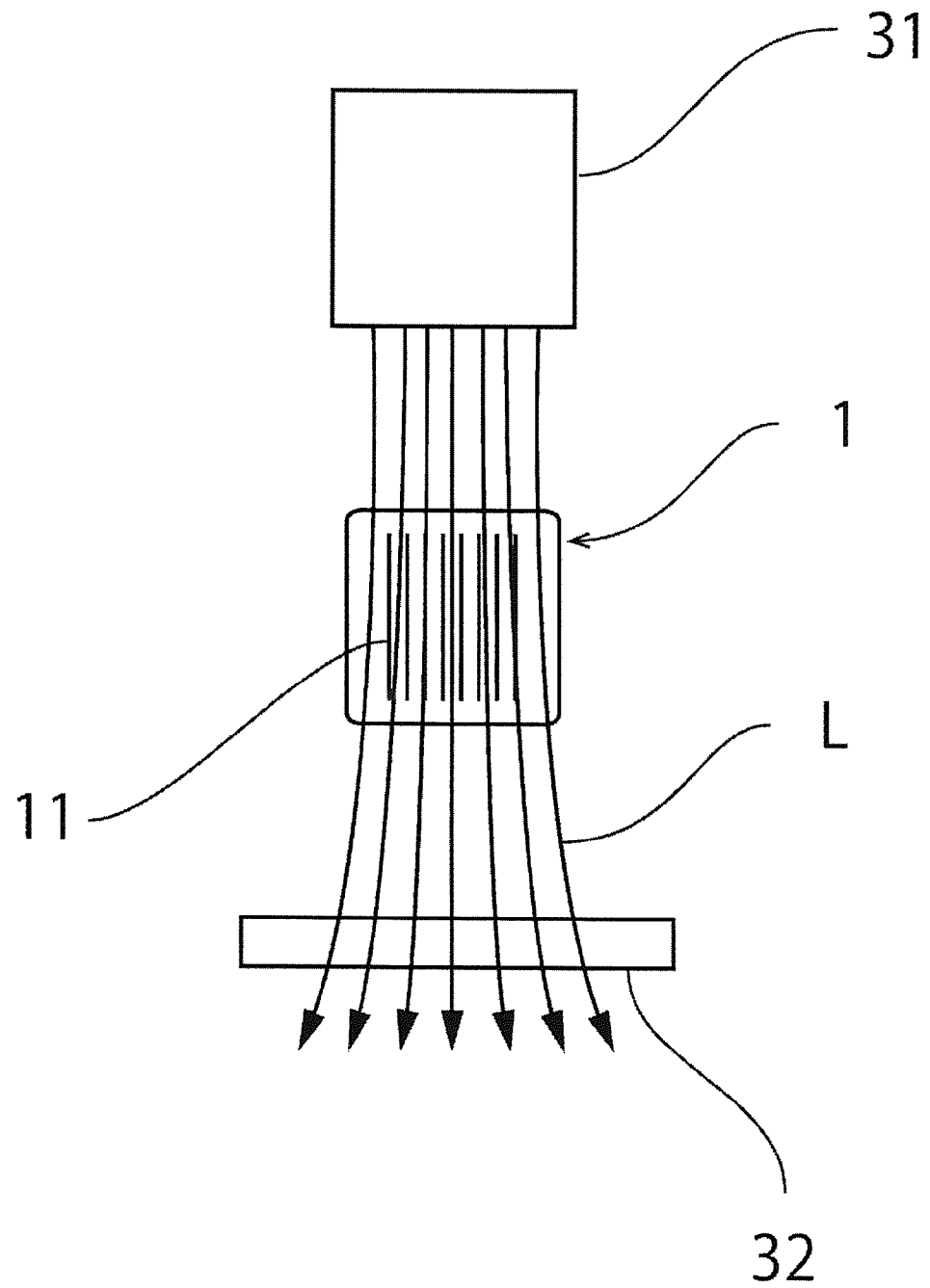
FIG. 8 is a schematic diagram of lines of magnetic force in a case in which a stacked ceramic capacitor is located between the magnetism generation apparatus and the magnetic flux density measurement instrument such that internal electrodes are parallel or substantially parallel to a direction of magnetic flux (as a capacitor, the internal electrodes extend in a direction perpendicular or substantially perpendicular to a bottom surface).

As shown in FIGS. 7 and 8, when stacked ceramic capacitor 1 is located between magnetism generation apparatus 31 and magnetic flux density measurement instrument 32, an interval between lines of magnetic force L which pass magnetic flux density measurement instrument 32 is narrower than when no stacked ceramic capacitor 1 is located. In other words, the number of lines of magnetic force L per unit area is greater, and a high value for magnetic flux density is obtained.

Among others, an interval between lines of magnetic force L which pass magnetic flux density measurement instrument 32 is narrower in a case shown in FIG. 8 that a direction of stacking of internal electrodes 11, 12 is parallel or substantially parallel to a direction of magnetic flux (as a capacitor, internal electrodes are in a direction perpendicular or substantially perpendicular to a bottom surface) than in a case shown in FIG. 7 that it is perpendicular or substantially perpendicular (as a capacitor, internal electrodes extend in a direction parallel or substantially parallel to the bottom surface). In other words, the number of lines of magnetic force L per unit area is greater, and a high value for magnetic flux density is obtained.

Therefore, magnetic flux density measured with magnetic flux density measurement instrument 32 varies depending on presence and absence of stacked ceramic capacitor 1 and a direction of stacking in stacked ceramic capacitor 1. In the identification method in the present preferred embodiment, this principle is used to identify a direction of stacking in stacked ceramic capacitor 1.

While density of magnetic flux generated from magnetism generation apparatus 31 is measured with magnetic flux density measurement instrument 32, stacked ceramic capacitor 1 is caused to pass between magnetism generation apparatus 31 and magnetic flux density measurement instrument 32 and variation in magnetic flux density at least at the time of passage of stacked ceramic capacitor is measured. Then, identification portion 36 identifies a direction of stacking in stacked ceramic capacitor 1 based on a result of measurement of magnetic flux density.

Thus, in the present preferred embodiment, in order to measure variation in magnetic flux density at the time of passage, stacked ceramic capacitor 1 is not turned when stacked ceramic capacitor 1 is caused to pass between magnetism generation apparatus 31 and magnetic flux density measurement instrument 32. By causing stacked ceramic capacitor 1 to pass without turning the same, variation in measurement position due to turning can be avoided.

The identification method in the present preferred embodiment will now be described in further detail with reference to examples shown in FIGS. 9 to 12. It is noted that, in FIGS. 9 to 12, the abscissa represents a coordinate of a position of measurement of magnetic flux density in a direction of extension of the series of stacked ceramic capacitors 2. In FIGS. 9 to 12, the ordinate represents magnetic flux density measured with magnetic flux density measurement instrument 32.

In the present preferred embodiment, identification portion 36 smoothes magnetic flux density data by taking a moving average of unprocessed magnetic flux density data output from magnetic flux density measurement instrument 32. The graphs shown in FIGS. 9 to 12 represent smoothed data. In the present preferred embodiment, a direction of stacking in stacked ceramic capacitor 1 is identified by using smoothed data as shown in FIGS. 9 to 12.

In the examples shown in FIGS. 9 to 12, a stacked ceramic capacitor 1a, a stacked ceramic capacitor 1b, and a stacked ceramic capacitor 1c are aligned in this order from the second roller 34 side. Therefore, stacked ceramic capacitor 1a, stacked ceramic capacitor 1b, and stacked ceramic capacitor 1c pass between magnetism generation apparatus 31 and magnetic flux density measurement instrument 32 in that order. Here, a case in which a direction of stacking in stacked ceramic capacitor 1b is identified will be described.

It is noted that a capacitor in which a direction of stacking of internal electrodes 11, 12 is perpendicular or substantially perpendicular to a direction of magnetic flux is defined as a "parallel product" (because internal electrodes are arranged parallel or substantially parallel to a bottom surface as a stacked ceramic capacitor). A capacitor in which a direction of stacking of internal electrodes 11, 12 is parallel or substantially parallel to a direction of magnetic flux is defined as an "perpendicular product" (because internal electrodes are perpendicular or substantially perpendicular to a bottom surface as a stacked ceramic capacitor).

In addition, regarding measured magnetic flux density, not only magnetic flux density in a region where stacked ceramic capacitor 1b is located varies depending on a direction of stacking in stacked ceramic capacitor 1b, but also magnetic flux density in a region where stacked ceramic capacitors 1a to 1c are not located varies under influence of a direction of stacking in stacked ceramic capacitors 1a to 1c before and after passage.

Figure 9:
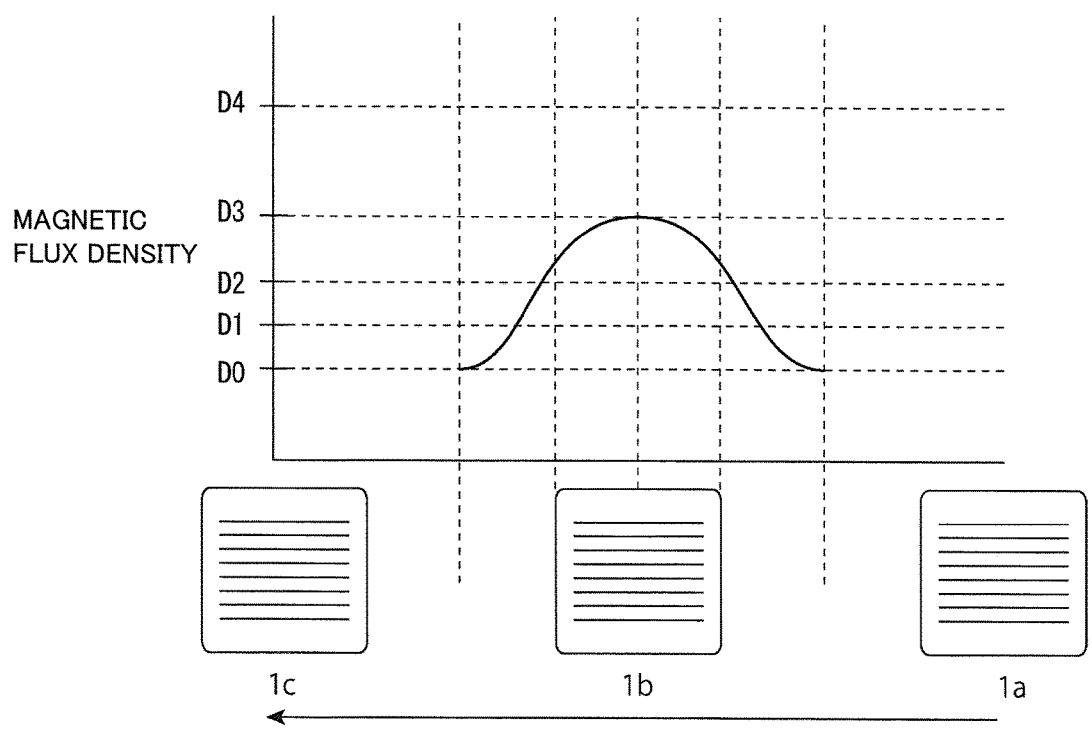
FIG. 9 is a schematic graph representing magnetic flux density in a case in which stacked ceramic capacitors are aligned in an order of a parallel product, a parallel product, and a parallel product.

In the example shown in FIG. 9, stacked ceramic capacitors 1a to 1c are all parallel products. In the example shown in FIG. 10, stacked ceramic capacitors 1a to 1c are all perpendicular products.

Figure 10:
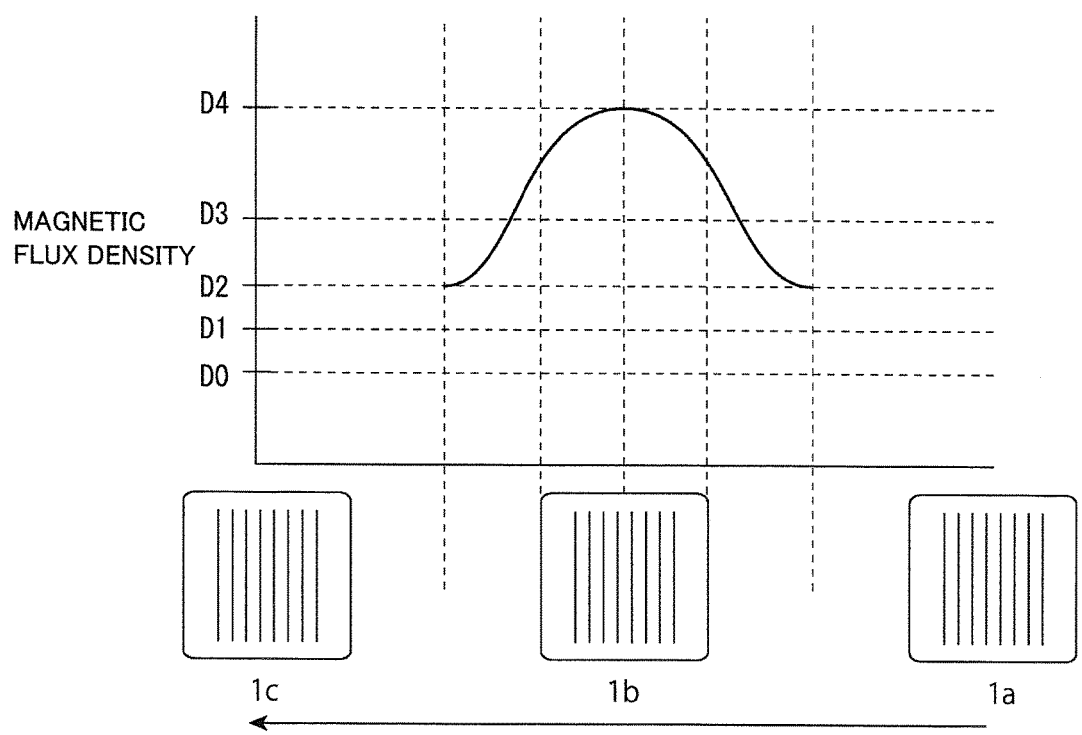
FIG. 10 is a schematic graph representing magnetic flux density in a case in which stacked ceramic capacitors are aligned in an order of a perpendicular product, a perpendicular product, and a perpendicular product.

Therefore, magnetic flux density measured at a position intermediate between stacked ceramic capacitor 1a and stacked ceramic capacitor 1b attains D0 in an example shown in FIG. 9 in which stacked ceramic capacitors 1a, 1b are both parallel products, whereas it attains D2 higher than D0 in an example shown in FIG. 10 in which stacked ceramic capacitors 1a, 1b are both perpendicular products.

Alternatively, magnetic flux density measured in a region where stacked ceramic capacitor 1b is located attains D3 in the example as shown in FIG. 9 in which stacked ceramic capacitor 1b is a parallel product, whereas it attains D4 higher than D3 in the example as shown in FIG. 10 in which stacked ceramic capacitor 1b is a perpendicular product.

Figure 11:
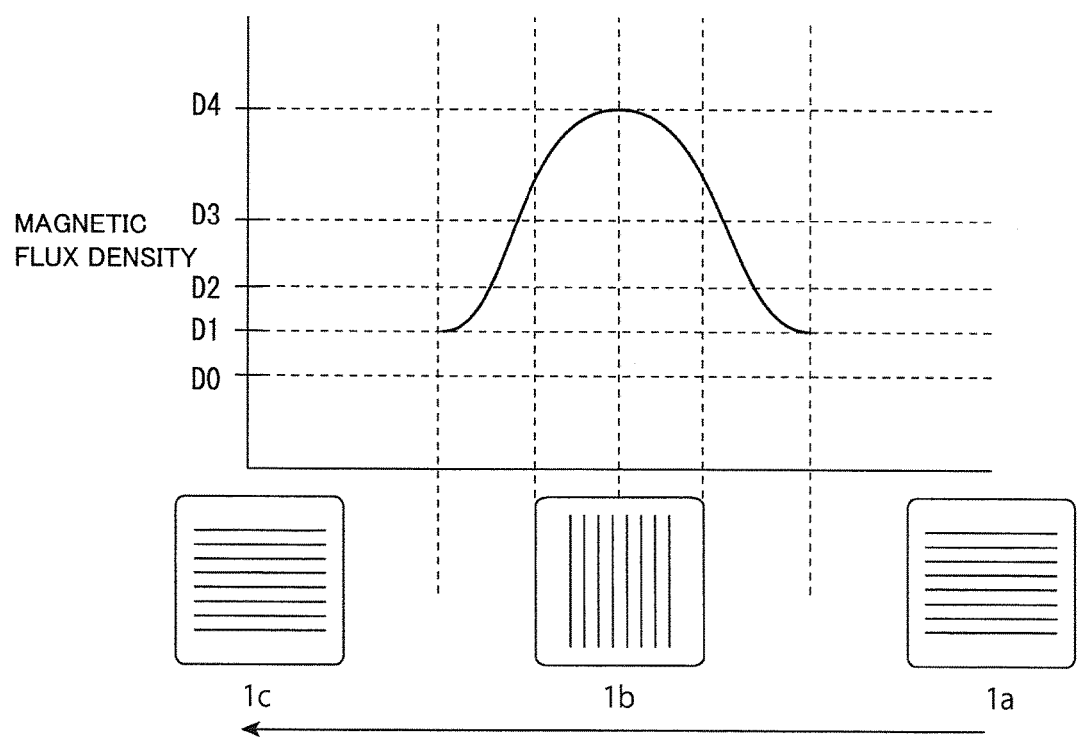
FIG. 11 is a schematic graph representing magnetic flux density in a case in which stacked ceramic capacitors are aligned in an order of a parallel product, a perpendicular product, and a parallel product.

In the example shown in FIG. 11, stacked ceramic capacitor 1a is a parallel product and stacked ceramic capacitor 1b is a perpendicular product. Therefore, magnetic flux density measured at a position intermediate between stacked ceramic capacitor 1a and stacked ceramic capacitor 1b attains D1 which is higher than D0 and lower than D2. Magnetic flux density measured in a region where stacked ceramic capacitor 1b is located attains D4.

Figure 12:
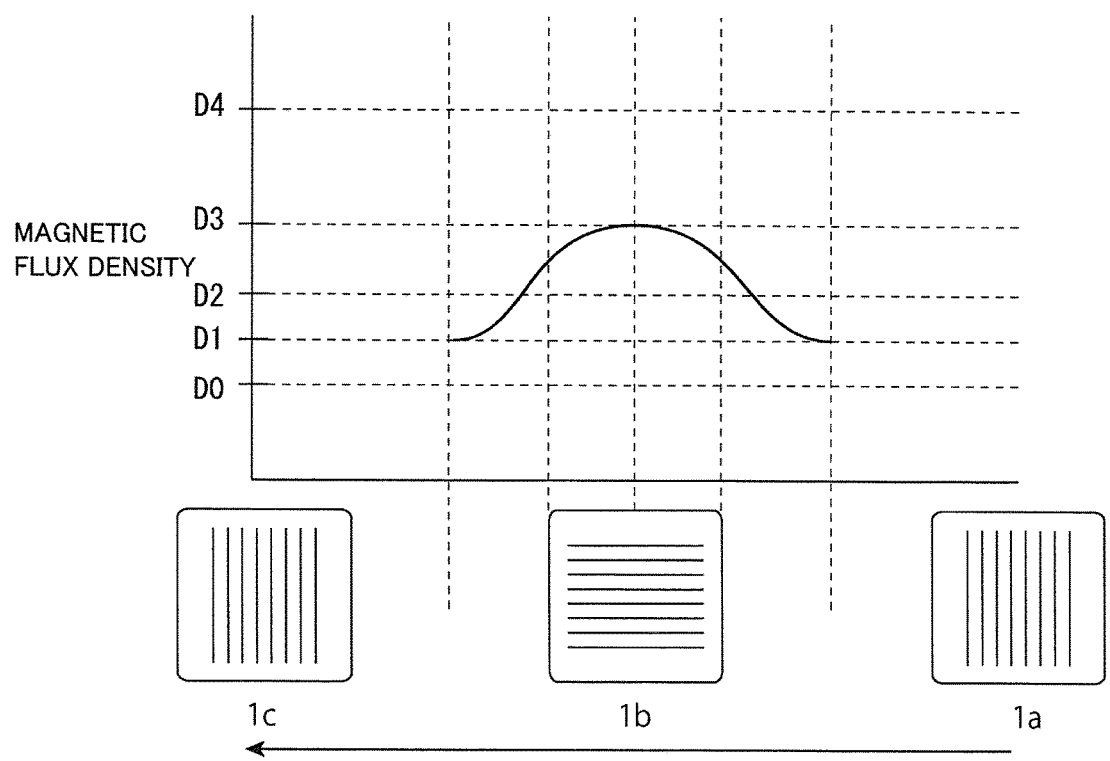
FIG. 12 is a schematic graph representing magnetic flux density in a case in which stacked ceramic capacitors are aligned in an order of a perpendicular product, a parallel product, and a perpendicular product.

In the example shown in FIG. 12, stacked ceramic capacitor 1a is a perpendicular product and stacked ceramic capacitor 1b is a parallel product. Therefore, magnetic flux density measured at a position intermediate between stacked ceramic capacitor 1a and stacked ceramic capacitor 1b attains D1 which is higher than D0 and lower than D2. Magnetic flux density measured in a region where stacked ceramic capacitor 1b is located attains D3.

It is noted that a difference in magnetic flux density between D2 and D3 is generally smaller than a difference in magnetic flux density between D3 and D4.

Furthermore, magnetic flux density at a central position of stacked ceramic capacitor 1b is significantly different from magnetic flux density at an end portion of stacked ceramic capacitor 1b. For example, magnetic flux density at the end portion of stacked ceramic capacitor 1b is approximately an average of magnetic flux density at the central position of stacked ceramic capacitor 1b and magnetic flux density measured at a position intermediate between stacked ceramic capacitor 1a and stacked ceramic capacitor 1b.

More specific first to fourth stack direction identification methods will be described below.

Figure 13:
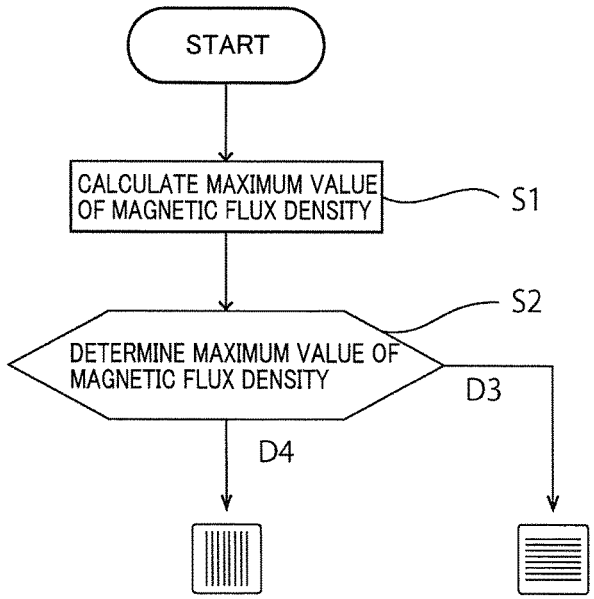
FIG. 13 is a flowchart representing a first stack direction identification method.

FIG. 13 is a flowchart showing the first stack direction identification method. As shown in FIG. 13, in the first stack direction identification method, initially, in step S1, identification portion 36 calculates a maximum value of magnetic flux density from a result of measurement output from magnetic flux density measurement instrument 32. Then, in step S2, identification portion 36 identifies a direction of stacking in stacked ceramic capacitor 1b based on the maximum value of magnetic flux density.

As described previously, maximum value D4 of magnetic flux density measured when a direction of stacking of internal electrodes 11, 12 is parallel or substantially parallel to a direction of magnetic flux (a perpendicular product) is greater than maximum value D3 of magnetic flux density measured when a direction of stacking of internal electrodes 11, 12 is perpendicular or substantially perpendicular to a direction of magnetic flux (a parallel product). Therefore, by referring to the maximum value of magnetic flux density, a direction of stacking in stacked ceramic capacitor 1b can be identified.

Specifically, D3, D4 may be calculated and set from a plurality of results of measurement and a maximum value of magnetic flux density measured subsequently may be compared with D3, D4, or D3, D4 may be determined and set in advance and a maximum value of measured magnetic flux density may be compared with D3, D4 set in advance. Consequently, when a maximum value of magnetic flux density is D4, determination as a perpendicular product can be made, and when it is D3, determination as a parallel product can be made.

It is noted that, actually, a maximum value of magnetic flux density measured when a direction of stacking of internal electrodes 11, 12 is parallel or substantially parallel to a direction of magnetic flux, a maximum value measured when it is perpendicular or substantially perpendicular thereto, or the like does not attain to a certain value but it has a range. Therefore, D0 to D4 each have a range.

Figure 14:
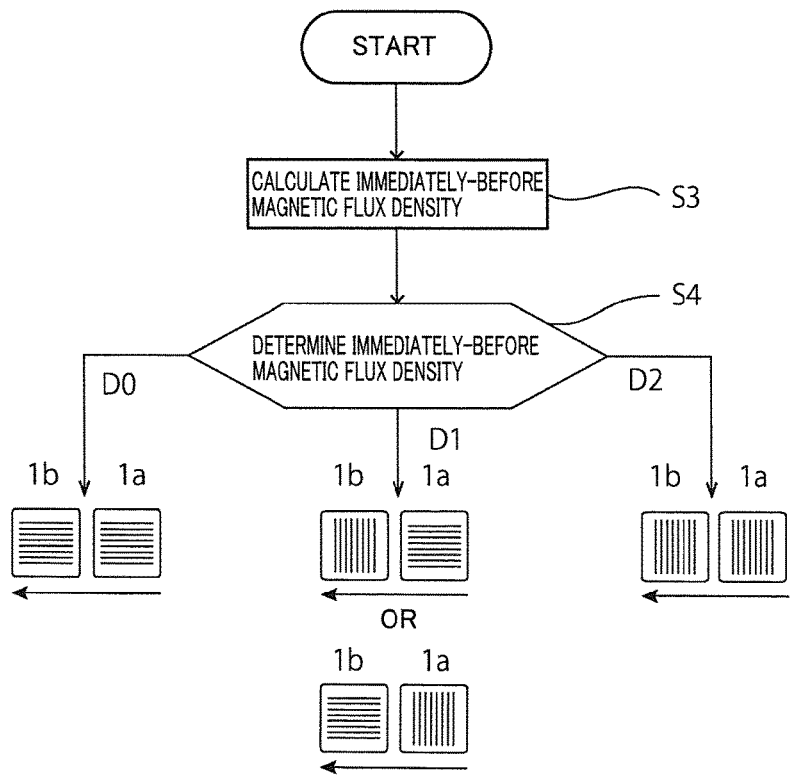
FIG. 14 is a flowchart representing a second stack direction identification method.

FIG. 14 is a flowchart representing the second stack direction identification method. As shown in FIG. 14, in the second stack direction identification method, initially, in step S3, magnetic flux density immediately before stacked ceramic capacitor 1b reaches a position between magnetism generation apparatus 31 and magnetic flux density measurement instrument 32 (immediately-before magnetic flux density) is calculated. Then, in step S4, identification portion 36 identifies a direction of stacking in stacked ceramic capacitor 1b based on the immediately-before magnetic flux density.

As described previously, immediately-before magnetic flux density measured when a direction of stacking of internal electrodes 11, 12 is parallel or substantially parallel to a direction of magnetic flux is different from immediately-before magnetic flux density measured when a direction of stacking of internal electrodes 11, 12 is perpendicular or substantially perpendicular to a direction of magnetic flux. Specifically, measured immediately-before magnetic flux density is different among a case where both of stacked ceramic capacitor 1b which is going to pass and stacked ceramic capacitor 1a which has previously passed are parallel products, a case where both of them are perpendicular products, and a case where one of them is a parallel product and the other is a perpendicular product.

Therefore, a direction of stacking in stacked ceramic capacitor 1b is identified by referring to immediately-before magnetic flux density. Specifically, when measured immediately-before magnetic flux density is D0, stacked ceramic capacitor 1b is identified as a parallel product. When measured immediately-before magnetic flux density is D2, stacked ceramic capacitor 1b is identified as a perpendicular product. When measured immediately-before magnetic flux density is D1, one of stacked ceramic capacitor 1a which has previously passed and stacked ceramic capacitor 1b which is going to pass is identified as a perpendicular product and the other of them is identified as a parallel product. Therefore, in order to reliably identify a direction in stacked ceramic capacitor 1b which is going to pass, another identification method is preferably further performed.

Figure 15:
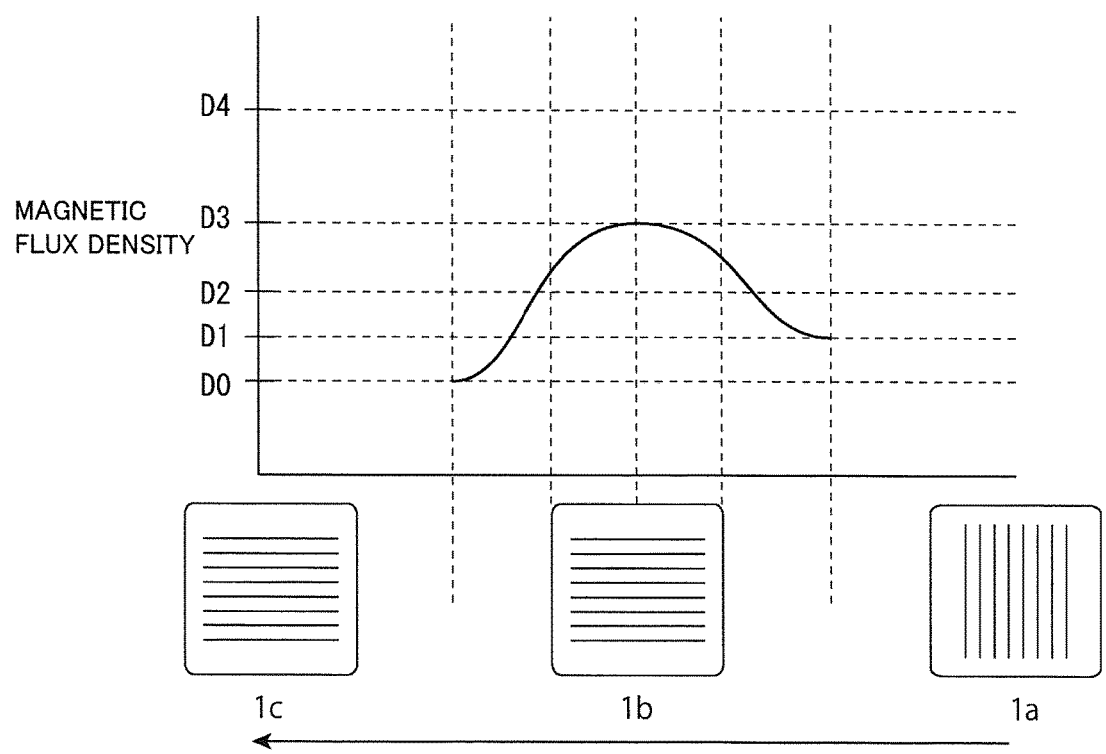
FIG. 15 is a schematic graph representing magnetic flux density in a case in which stacked ceramic capacitors are aligned in an order of a perpendicular product, a parallel product, and a parallel product.
Figure 16:
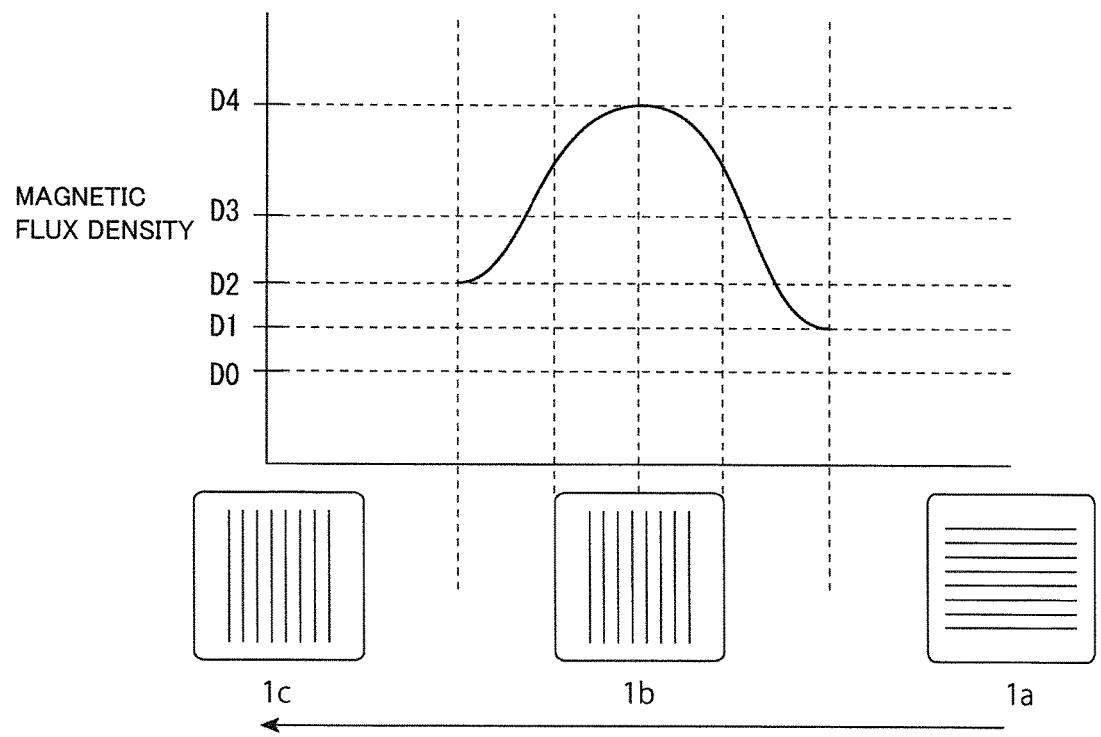
FIG. 16 is a schematic graph representing magnetic flux density in a case in which stacked ceramic capacitors are aligned in an order of a parallel product, a perpendicular product, and a perpendicular product.

For example, magnetic flux density immediately after passage of stacked ceramic capacitor 1b between magnetism generation apparatus 31 and magnetic flux density measurement instrument 32 (immediately-after magnetic flux density) may further be calculated and a direction of stacking in stacked ceramic capacitor 1b may be identified by further referring to immediately-after magnetic flux density. Specifically, when immediately-before magnetic flux density is D1 and immediately-after magnetic flux density is D0 as shown in FIG. 15, stacked ceramic capacitor 1b is identified as a parallel product. When immediately-before magnetic flux density is D1 and immediately-after magnetic flux density is D2 as shown in FIG. 16, stacked ceramic capacitor 1b is identified as a perpendicular product. When immediately-before magnetic flux density is D1 and immediately-after magnetic flux density is D1, magnetic flux density immediately after passage of stacked ceramic capacitor 1c between magnetism generation apparatus 31 and magnetic flux density measurement instrument 32 should only further be referred to. Thus, by conducting measurement until immediately-after magnetic flux density attains D0 or D2, a direction in stacked ceramic capacitor 1 is ascertained.

In the third identification method, initially, a relationship between a maximum value of magnetic flux density at the time of passage of stacked ceramic capacitor 1b between magnetism generation apparatus 31 and magnetic flux density measurement instrument 32 and a value for magnetic flux density immediately before (or immediately after) stacked ceramic capacitor 1b reaches a position between magnetism generation apparatus 31 and magnetic flux density measurement instrument 32, such as a difference in value therebetween (magnetic flux density difference), is calculated. Then, identification portion 36 identifies a direction of stacking in stacked ceramic capacitor 1b based on a difference in magnetic flux density.

The third stack direction identification method is effective to identify whether magnetic flux density is magnetic flux density in a region where a parallel product is located or magnetic flux density in a region where a stacked ceramic capacitor is not located. This is because, in general, magnetic flux density D3 in a region where a parallel product is located and intermediate magnetic flux density D2 in a case in which a stacked ceramic capacitor which is going to pass and a stacked ceramic capacitor which has previously passed are both perpendicular products may be close to each other, within a range of variation.

For example, in a case in which there is an accommodation chamber where no stacked ceramic capacitor is accommodated, in order to identify whether a parallel product is accommodated in that accommodation chamber or nothing is accommodated in that accommodation chamber, presence and absence of a stacked ceramic capacitor and a direction of stacking in a stacked ceramic capacitor is identified by considering not only a maximum value or being before and after passage but also a relationship therebetween (determination as a parallel product being made if change toward higher magnetic flux density is observed, determination that nothing is accommodated being made if a change toward lower magnetic flux density or no change is observed, or the like).

In the fourth stack direction identification method, an average value of magnetic flux densities during passage of stacked ceramic capacitor 1b between magnetism generation apparatus 31 and magnetic flux density measurement instrument 32 is calculated based on a result of measurement of magnetic flux density, and a direction of stacking in stacked ceramic capacitor 1b is identified based on the average value. For example, when all of stacked ceramic capacitors 1a to 1c are perpendicular products, an average value is highest and when all of them are parallel products, an average value is lowest.

Two or more of the first to fourth stack direction identification methods above may be performed as combined. By doing so, identification accuracy can be improved.

As described above, in various preferred embodiments of the present invention, while density of magnetic flux generated from magnetism generation apparatus 31 is measured with magnetic flux density measurement instrument 32, stacked ceramic capacitor 1b is caused to pass between magnetism generation apparatus 31 and magnetic flux density measurement instrument 32 and variation in magnetic flux density at least at the time of passage of stacked ceramic capacitor 1b is measured. Then, a direction of stacking in stacked ceramic capacitor 1b is identified based on the variation in magnetic flux density. Therefore, as described above, a direction of stacking of internal electrodes 11, 12 in stacked ceramic capacitor 1b is identified with high accuracy. For example, even when accommodation chamber 21 is greater than stacked ceramic capacitor 1 and stacked ceramic capacitor 1 is displaced, a direction of stacking of internal electrodes 11, 12 in stacked ceramic capacitor 1b is identified with high accuracy.

Although various preferred embodiments of the present invention has been described and illustrated in detail, it is clearly understood that the same is by way of illustration and example only and is not to be taken by way of limitation, the scope of the present invention being interpreted by the terms of the appended claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of manufacturing a stacked ceramic capacitor, comprising steps of:
   fabricating a stacked ceramic capacitor including a plurality of internal electrodes stacked in one direction; and
   identifying the one direction of stacking of the plurality of internal electrodes in the stacked ceramic capacitor by the steps of:
      measuring a variation in magnetic flux density at least at a time of passage of the stacked ceramic capacitor by causing the stacked ceramic capacitor to pass between a magnetism generation apparatus and a magnetic flux density measurement instrument while a density of magnetic flux generated from the magnetism generation apparatus is measured with the magnetic flux density measurement instrument; and
      wherein said identifying the one direction of stacking of the plurality of internal electrodes in the stacked ceramic capacitor is based on a result of measurement of the magnetic flux density obtained from the step of measuring a variation in magnetic flux density.

2. The method according to claim 1, wherein in the step of identifying the one direction of stacking of the plurality of internal electrodes, a maximum value of magnetic flux density is calculated based on the result of measurement of the magnetic flux density, and the one direction of stacking of the plurality of internal electrodes in the stacked ceramic capacitor is identified based on a maximum value of the magnetic flux density.

3. The method according to claim 2, wherein in the step of identifying the one direction of stacking of the plurality of internal electrodes, a first range which is a range of the maximum value of magnetic flux density in a case in which the one direction of stacking of the plurality of internal electrodes in the stacked ceramic capacitor is parallel or substantially parallel to a direction of magnetic flux and a second range which is a range of the maximum value of magnetic flux density in a case in which the one direction of stacking of the plurality of internal electrodes in the stacked ceramic capacitor is perpendicular or substantially perpendicular to a direction of magnetic flux are set, and the one direction of stacking of the plurality of internal electrodes in the stacked ceramic capacitor is identified based on whether the maximum value of measured magnetic flux density belongs to the first or second range.

4. The method according to claim 1, wherein
   the step of measuring a variation in magnetic flux density is performed successively for each of a plurality of the stacked ceramic capacitors aligned at an interval; and
   in the step of identifying the one direction of stacking of the plurality of internal electrodes, a magnetic flux density immediately before passage of the stacked ceramic capacitor between the magnetism generation apparatus and the magnetic flux density measurement instrument is calculated based on the result of measurement of the magnetic flux density, and the one direction of stacking of the plurality of internal electrodes in the stacked ceramic capacitor is identified based on the magnetic flux density immediately before passage.

5. The method according to claim 4, wherein in the step of identifying the one direction of stacking of the plurality of internal electrodes, magnetic flux density immediately after passage of the stacked ceramic capacitor between the magnetism generation apparatus and the magnetic flux density measurement instrument is further calculated based on the result of measurement of the magnetic flux density, and the one direction of stacking of the plurality of internal electrodes in the stacked ceramic capacitor is identified based on both of the magnetic flux density immediately before the passage and the magnetic flux density immediately after the passage.

6. The method according to claim 1, wherein in the step of identifying the one direction of stacking of the plurality of internal electrodes, a difference between a maximum value of magnetic flux density and magnetic flux density immediately before the stacked ceramic capacitor reaches a position between the magnetism generation apparatus and the magnetic flux density measurement instrument is calculated based on a result of measurement of the magnetic flux density, and the one direction of stacking of the plurality of internal electrodes in the stacked ceramic capacitor is identified based on the difference in magnetic flux density.

7. The method according to claim 1, wherein in the step of identifying the one direction of stacking of the plurality of internal electrodes, an average value of magnetic flux densities during passage of the stacked ceramic capacitor between the magnetism generation apparatus and the magnetic flux density measurement instrument is calculated based on the result of measurement of the magnetic flux density, and the one direction of stacking of the plurality of internal electrodes in the stacked ceramic capacitor is identified based on the average value of the magnetic flux densities.

8. The method according to claim 1, wherein in the step of identifying the one direction of stacking of the plurality of internal electrodes, the result of measurement of the magnetic flux density is smoothed by taking a moving average of measured magnetic flux densities.

\* \* \* \* \*